United States Patent
Mears et al.

(10) Patent No.: US 8,389,974 B2
(45) Date of Patent: *Mar. 5, 2013

(54) MULTIPLE-WAVELENGTH OPTO-ELECTRONIC DEVICE INCLUDING A SUPERLATTICE

(75) Inventors: Robert J. Mears, Wellesley, MA (US); Robert John Stephenson, Newton Upper Falls, MA (US); Marek Hytha, Brookline, MA (US); Ilija Dukovski, Newtonville, MA (US); Jean Augustin Chan Sow Fook Yiptong, Worchester, MA (US); Samed Halilov, Waltham, MA (US); Xiangyang Huang, Waltham, MA (US)

(73) Assignee: Mears Technologies, Inc., Newton, MA (US)

( * ) Notice: Subject to any disclaimer, the term of this patent is extended or adjusted under 35 U.S.C. 154(b) by 125 days.

This patent is subject to a terminal disclaimer.

(21) Appl. No.: 13/017,863

(22) Filed: Jan. 31, 2011

(65) Prior Publication Data

US 2011/0193063 A1  Aug. 11, 2011

Related U.S. Application Data

(63) Continuation of application No. 11/675,833, filed on Feb. 16, 2007, now Pat. No. 7,880,161.

(51) Int. Cl.
*H01L 29/06* (2006.01)
*H01L 21/00* (2006.01)

(52) U.S. Cl. ............. 257/9; 257/E29.002; 257/E31.032; 438/57

(58) Field of Classification Search .......... None
See application file for complete search history.

(56) References Cited

U.S. PATENT DOCUMENTS

| | | | | |
|---|---|---|---|---|
| 4,205,331 A | 5/1980 | Esaki et al. | ...................... | 357/30 |
| 4,287,527 A * | 9/1981 | Bachmann et al. | ........... | 257/441 |
| 4,370,510 A | 1/1983 | Stirn | ............................. | 136/262 |
| 4,485,128 A | 11/1984 | Dalal et al. | ....................... | 427/85 |
| 4,594,603 A | 6/1986 | Holonyak, Jr. | ................... | 357/16 |
| 4,598,164 A | 7/1986 | Tiedje et al. | .................... | 136/249 |
| 4,688,068 A | 8/1987 | Chaffin et al. | ................... | 357/30 |
| 4,882,609 A | 11/1989 | Schubert et al. | ................. | 357/22 |
| 4,908,678 A | 3/1990 | Yamazaki | .......................... | 357/4 |

(Continued)

FOREIGN PATENT DOCUMENTS

| | | |
|---|---|---|
| EP | 0 843 361 | 5/1998 |
| GB | 2347520 | 9/2000 |

(Continued)

OTHER PUBLICATIONS

Luo et al., Chemical Design of Direct-Gap Light-Emitting Silicon, published Jul. 25, 2002, The American Physical Society; vol. 89, No. 7.

(Continued)

*Primary Examiner* — Ha Tran T Nguyen
*Assistant Examiner* — Kevin Quinto
(74) *Attorney, Agent, or Firm* — Allen, Dyer, Doppelt, Milbrath & Gilchrist, P.A.

(57) ABSTRACT

A multiple-wavelength opto-electronic device may include a substrate and a plurality of active optical devices carried by the substrate and operating at different respective wavelengths. Each optical device may include a superlattice comprising a plurality of stacked groups of layers, and each group of layers may include a plurality of stacked semiconductor monolayers defining a base semiconductor portion and at least one non-semiconductor monolayer thereon.

34 Claims, 9 Drawing Sheets

U.S. PATENT DOCUMENTS

| | | | |
|---|---|---|---|
| 4,937,204 A | 6/1990 | Ishibashi et al. | 437/110 |
| 4,969,031 A | 11/1990 | Kobayashi et al. | 357/63 |
| 5,055,887 A | 10/1991 | Yamazaki | 357/4 |
| 5,081,513 A | 1/1992 | Jackson et al. | 357/23.7 |
| 5,216,262 A | 6/1993 | Tsu | 257/17 |
| 5,338,970 A * | 8/1994 | Boyle et al. | 257/659 |
| 5,357,119 A | 10/1994 | Wang et al. | 257/18 |
| 5,577,061 A | 11/1996 | Hasenberg et al. | 372/45 |
| 5,594,567 A | 1/1997 | Akiyama et al. | 349/28 |
| 5,606,177 A | 2/1997 | Wallace et al. | 257/25 |
| 5,616,515 A | 4/1997 | Okuno | 438/478 |
| 5,627,386 A | 5/1997 | Harvey et al. | 257/79 |
| 5,683,934 A | 11/1997 | Candelaria | 437/134 |
| 5,684,817 A | 11/1997 | Houdre et al. | 372/45 |
| 5,994,164 A | 11/1999 | Fonash et al. | 438/97 |
| 6,058,127 A | 5/2000 | Joannopoulos et al. | 372/92 |
| 6,255,150 B1 | 7/2001 | Wilk et al. | 438/191 |
| 6,274,007 B1 | 8/2001 | Smirnov et al. | 204/192 |
| 6,281,518 B1 | 8/2001 | Sato | 257/13 |
| 6,281,532 B1 | 8/2001 | Doyle et al. | 257/288 |
| 6,326,311 B1 | 12/2001 | Ueda et al. | 438/694 |
| 6,344,271 B1 | 2/2002 | Yadav et al. | 428/402 |
| 6,350,993 B1 | 2/2002 | Chu et al. | 257/19 |
| 6,376,337 B1 | 4/2002 | Wang et al. | 438/478 |
| 6,436,784 B1 | 8/2002 | Allam | 438/380 |
| 6,456,407 B1 | 9/2002 | Tammela et al. | 398/59 |
| 6,472,685 B2 | 10/2002 | Takagi | 257/77 |
| 6,498,359 B2 | 12/2002 | Schmidt et al. | 257/190 |
| 6,501,092 B1 | 12/2002 | Nikonov et al. | 257/29 |
| 6,521,549 B1 | 2/2003 | Kamath et al. | 438/786 |
| 6,566,679 B2 | 5/2003 | Nikonov et al. | 257/29 |
| 6,607,980 B2 | 8/2003 | Uchiyama et al. | 438/660 |
| 6,608,327 B1 | 8/2003 | Davis et al. | 257/76 |
| 6,621,097 B2 | 9/2003 | Nikonov et al. | 257/17 |
| 6,638,838 B1 | 10/2003 | Eisenbeiser et al. | 438/481 |
| 6,646,293 B2 | 11/2003 | Emrick et al. | 257/194 |
| 6,673,646 B2 | 1/2004 | Droopad | 438/85 |
| 6,690,699 B2 | 2/2004 | Capasso et al. | 372/44 |
| 6,711,191 B1 | 3/2004 | Kozaki et al. | 372/43 |
| 6,748,002 B2 | 6/2004 | Shveykin | 372/45 |
| 6,816,530 B2 | 11/2004 | Capasso et al. | 372/50 |
| 6,830,964 B1 * | 12/2004 | Mears et al. | 438/162 |
| 6,891,869 B2 | 5/2005 | Augusto | 372/43 |
| 7,625,767 B2 | 12/2009 | Huang et al. | 438/3 |
| 7,880,161 B2 * | 2/2011 | Mears et al. | 257/9 |
| 2002/0055200 A1 | 5/2002 | Kondo et al. | 438/106 |
| 2002/0094003 A1 | 7/2002 | Bour et al. | 372/46 |
| 2002/0145139 A1 | 10/2002 | Wagner et al. | 257/53 |
| 2003/0034529 A1 | 2/2003 | Fitzgerald et al. | 257/369 |
| 2003/0057416 A1 | 3/2003 | Currie et al. | 257/19 |
| 2003/0089899 A1 | 5/2003 | Lieber et al. | 257/9 |
| 2003/0162335 A1 | 8/2003 | Yuki et al. | 438/151 |
| 2003/0215990 A1 | 11/2003 | Fitzgerald et al. | 438/172 |
| 2004/0084781 A1 | 5/2004 | Ahn et al. | 257/777 |
| 2004/0227165 A1 | 11/2004 | Wang et al. | 257/222 |
| 2005/0031247 A1 | 2/2005 | Mears et al. | 385/14 |
| 2007/0151595 A1 | 7/2007 | Chiou et al. | 136/255 |
| 2007/0190670 A1 | 8/2007 | Forest | 438/3 |
| 2007/0262295 A1 | 11/2007 | Enicks | 257/19 |
| 2008/0012004 A1 | 1/2008 | Huang et al. | 257/20 |
| 2009/0165839 A1 | 7/2009 | Zeman et al. | 136/244 |

FOREIGN PATENT DOCUMENTS

| | | |
|---|---|---|
| JP | 61027681 | 2/1986 |
| JP | 61145820 | 7/1986 |
| JP | 61220339 | 9/1986 |
| JP | 62219665 | 9/1987 |
| WO | 99/63580 | 12/1999 |
| WO | 02/103767 | 12/2002 |
| WO | 2005/106966 | 11/2005 |

OTHER PUBLICATIONS

Tsu, Phenomena in Silicon Nanostructure Devices, University of North Carolina at Charlotte, Sep. 6, 2000.

Ye et al., GaAs MOSFET with Oxide Gate Dielectric Grown by Atomic Layer Deposition, Agere Systems, Mar. 2003.

Novikov et al., Silicon-based Optoelectronics, 1999-2003, pp. 1-6.

Fan et al., N- and P-Type SiGe/Si Superlattice Coolers, the Seventeenth Intersociety Conference on Thermomechanical Phenomena in Electronic Systems (ITherm 2000), vol. 1, pp. 304-307, Las Vegas, NV, May 2000.

Shah et al., Experimental Analysis and Theoretical Model for Anomalously High Ideality Factors (n>2.0) in AlGaN/GaN P-N Junction Diodes, Journal of Applied Physics, vol. 94, No. 4, Aug. 15, 2003.

Ball, Striped Nanowires Shrink Electronics, news@nature.com, Feb. 7, 2002.

Fiory et al., Light Emission from Silicon: Some Perspectives and Applications, Journal of Electronic Materials, vol. 32, No. 10, 2003.

Lecture 6: Light Emitting and Detecting Devices, MSE 6001, Semiconductor Materials Lectures, Fall 2004.

Lieber, Harvard University Professor and Nanosys Co-Founder, Raises the Stakes in the Development of Nanoscale Superlattice Structures and Nanodevices, Feb. 8, 2002, Nanosys, Inc.

Burgess, *Electronics Integrated with Photonics in 3-D on Silicon Chip*, Photonics Spectra, Jan. 2006.

Huang et al., "A Exploration for Si-Based Superlattices Structure with Direct Band-Gap" XP002357978, http://phys.cts.nthu.edu.tw/workshop/ESC/mchuang.pdf, 2005, 6 pages.

Tsu et al., "Structure of MBE grown Semiconductor-Atomic Superlattices", Journal of Crystal Growth, Elsevier, Amsterdam, NL, vol. 227-228, Jul. 1, 2001, pp. 21-26, XP004250792, ISSN: 0022-0248.

Dovidenko et al., "Structure and Optoelectronic Properties of SI/0 Superlattice" Physica E—Low-Dimensional Systems and Nanostructures, Elseveir Science BV, NL, vol. 16, No. 3/04, Mar. 1, 2003, pp. 509-516, XP008057161, ISSN: 1386-9477.

Tsu, "A Review on Epitaxial SI/Oxygen Superlattice AS: SI Light Emitter and Insulating Barrier" Electrochemical Society Proceedings, Electrochemical Society, Pennington, NJ, US, vol. 98-19, Jan. 1, 1999, pp. 3-16, XP008057105, ISSN: 0161-6374.

Wanlass et al., "Superlattice Cascade Solar Cell", Photovoltaic Specialists Conference, San Diego, Sep. 27-30, 1982, New York, IEEE, US, vol. Conf. 16, pp. 584-589, XP000092004.

Enicks et al. *"Thermal Redistribution of Oxygen and Carbon in Boron-Doped Pseudomorphic SiGeC Heterojunction Nanometer Base Layers"* Journal of The Electrochemical Society; 153 (6) G529-G533 (2006).

Enicks et al. *"A Study of Process-Induced Oxygen Updiffusion in Pseudomorphic Boron-Doped Sub-50nm SiGeC Layers Grown by LPCVD"* Electrochemical and Solid-State Letters, 8 (10) G286-G289 (2005).

Enicks et al. *"Thermal Redistribution of Oxygen and Carbon IN Sub-50NM Strained Layers of Boron Doped SiGeC"* ECS Transactions, 3 (7) 1087-1098 (2006).

\* cited by examiner

MULTIPLE-WAVELENGTH OPTO-ELECTRONIC DEVICE INCLUDING A SUPERLATTICE

This application is a continuation of Ser. No. 11/675,833 filed Feb. 16, 2007 now U.S. Pat. No. 7,880,161 issued Feb. 1, 2011, the entire disclosure of which is hereby incorporated herein by reference.

FIELD OF THE INVENTION

Background of the Invention

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fraction or a binary compound semiconductor layers, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of $SiO_2$/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in silicon quantum and light-emitting devices. In particular, a green electroluminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical. Design of Direct-Gap Light-Emitting Silicon" published in Physical Review Letters, Vol. 89, No. 7 (Aug. 12, 2002) further discusses the light emitting SAS structures of Tsu.

Published International Application WO 02/103,767 A1 to Wang, Tsu and Lofgren, discloses a barrier building block of thin silicon and oxygen, carbon, nitrogen, phosphorous, antimony, arsenic or hydrogen to thereby reduce current flowing vertically through the lattice by more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc., can be tailored to yield new aperiodic materials with desirable band-structure characteristics. Other parameters, such as electrical conductivity, thermal conductivity and dielectric permittivity or magnetic permeability are disclosed as also possible to be designed into the material.

Despite considerable efforts at materials engineering to increase the mobility of charge carriers in semiconductor devices, there is still a need for greater improvements. Greater mobility may increase device speed and/or reduce device power consumption. With greater mobility, device performance can also be maintained despite the continued shift to smaller devices and new device configurations.

One particular application in which improved materials providing greater mobility may be desirable is optical devices. For example, typical optical detectors used in solar (i.e., photovoltaic) cells are made of amorphous silicon and are thus relatively inefficient. As such, to provide desired power output in many applications a relatively large surface area has to be covered with such solar cells, which may not be practical. Accordingly, it would be desirable to incorporate materials with enhanced mobility in solar cells to improve efficiency thereof with reduced weight and/or surface area requirements.

SUMMARY OF THE INVENTION

In view of the foregoing background, it is therefore an object of the present invention to provide a multiple-wavelength opto-electronic device having enhanced mobility characteristics.

This and other objects, features, and advantages are provided by a multiple-wavelength opto-electronic device which may include a substrate and a plurality of active optical devices carried by the substrate and operating at different respective wavelengths. Moreover, each optical device may include a superlattice comprising a plurality of stacked groups of layers, and each group of layers may include a plurality of stacked semiconductor monolayers defining a base semiconductor portion and at least one non-semiconductor monolayer thereon. More particularly, the at least one non-semiconductor monolayer may be constrained within a crystal lattice of adjacent base semiconductor portions, and at least some semiconductor atoms from opposing base semiconductor portions may be chemically bound together through the at least one non-semiconductor monolayer therebetween.

In addition, each active optical device may further include first and second semiconductor regions on opposing sides of the superlattice and having opposite conductivity types. The optical devices may be stacked in a vertical direction, as well as positioned laterally adjacent one another, for example. The plurality of superlattices may have different numbers of semiconductor monolayers in their respective base semiconductor portions, for example.

By way of example, the active optical devices may be optical detectors. Moreover, the optical detectors may be configured to provide an output equal to a sum of photocurrents therefrom, thereby providing an efficient solar cell arrangement. In other embodiments, the active optical devices may comprise optical transmitters, or both optical detectors and transmitters may be used in the same device.

Each superlattice may have a substantially direct bandgap. Moreover, each superlattice may also have a different respective bandgap. The multiple-wavelength opto-electronic device may further include at least one contact coupled to the plurality of active optical devices. The substrate may comprise various materials including semiconductors and non-semiconductors. In accordance with one exemplary embodiment, the substrate may comprise glass.

Additionally, each base semiconductor portion may comprise a base semiconductor selected from the group consisting of Group IV semiconductors, Group III-V semiconductors, and Group II-VI semiconductors. By way of example, the base semiconductor portions may comprise silicon. Also, each non-semiconductor monolayer may comprise a non-semiconductor selected from the group consisting of oxygen, nitrogen, fluorine, and carbon-oxygen, for example.

DETAILED DESCRIPTION OF THE PREFERRED EMBODIMENTS

Figure 1:
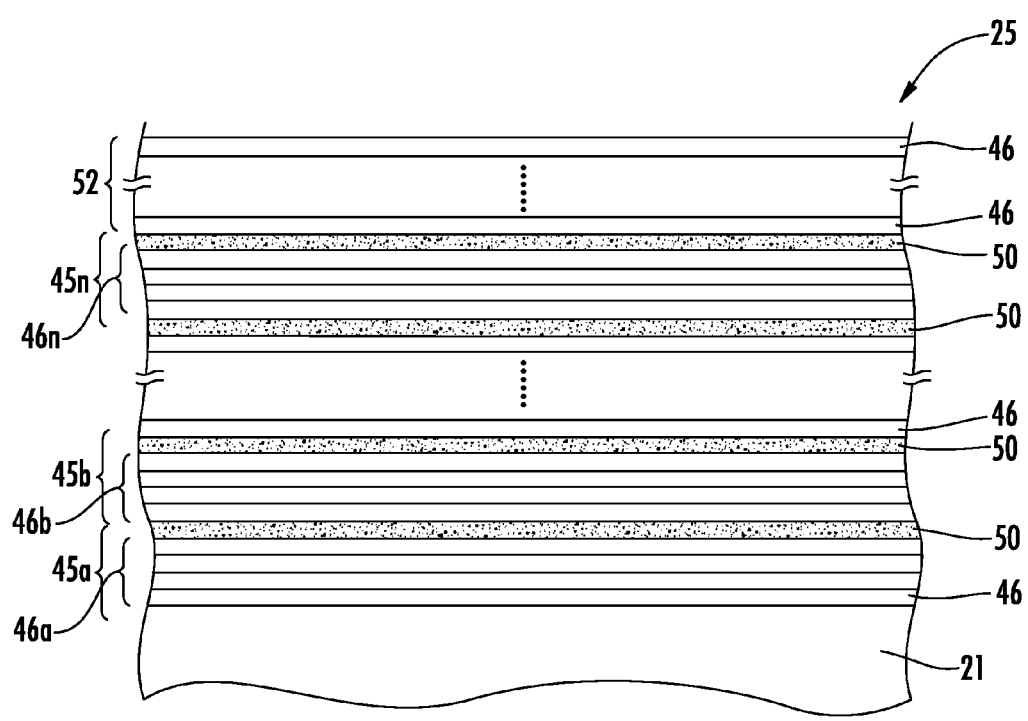
FIG. 1 is a greatly enlarged schematic cross-sectional view of a superlattice for use in a semiconductor device in accordance with the present invention.

The present invention will now be, described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in different embodiments.

The present invention relates to controlling the properties of semiconductor materials at the atomic or molecular level. Further, the invention relates to the identification, creation, and use of improved materials for use in semiconductor devices.

Applicants theorize, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicants use a "conductivity reciprocal effective mass tensor", $M_e^{-1}$ and $M_h^{-1}$ for electrons and holes respectively, defined as:

$$M_{e,ij}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} f(E(k,n), E_F, T) d^3k}$$

for electrons and:

$$M_{h,ij}^{-1}(E_F, T) =$$

$$-\frac{\sum_{E<E_F} \int_{B.Z.} (\nabla_k E(k,n))_i (\nabla_k E(k,n))_j \frac{\partial f(E(k,n), E_F, T)}{\partial E} d^3k}{\sum_{E<E_F} \int_{B.Z.} (1 - f(E(k,n), E_F, T)) d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicants' definition of the conductivity reciprocal effective mass tensor is such that a tensorial component of the conductivity of the material is greater for greater values of the corresponding component of the conductivity reciprocal effective mass tensor. Again Applicants theorize without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Applicants have identified improved materials or structures for use in semiconductor devices. More specifically, the Applicants have identified materials or structures having energy band structures for which the appropriate conductivity effective masses for electrons and/or holes are substantially less than the corresponding values for silicon. In addition to the enhanced mobility characteristics of these structures, they may also be formed or used in such a manner that they provide piezoelectric, pyroelectric, and/or ferroelectric properties that are advantageous for use in a variety of different types of devices, as will be discussed further below.

Figure 2:
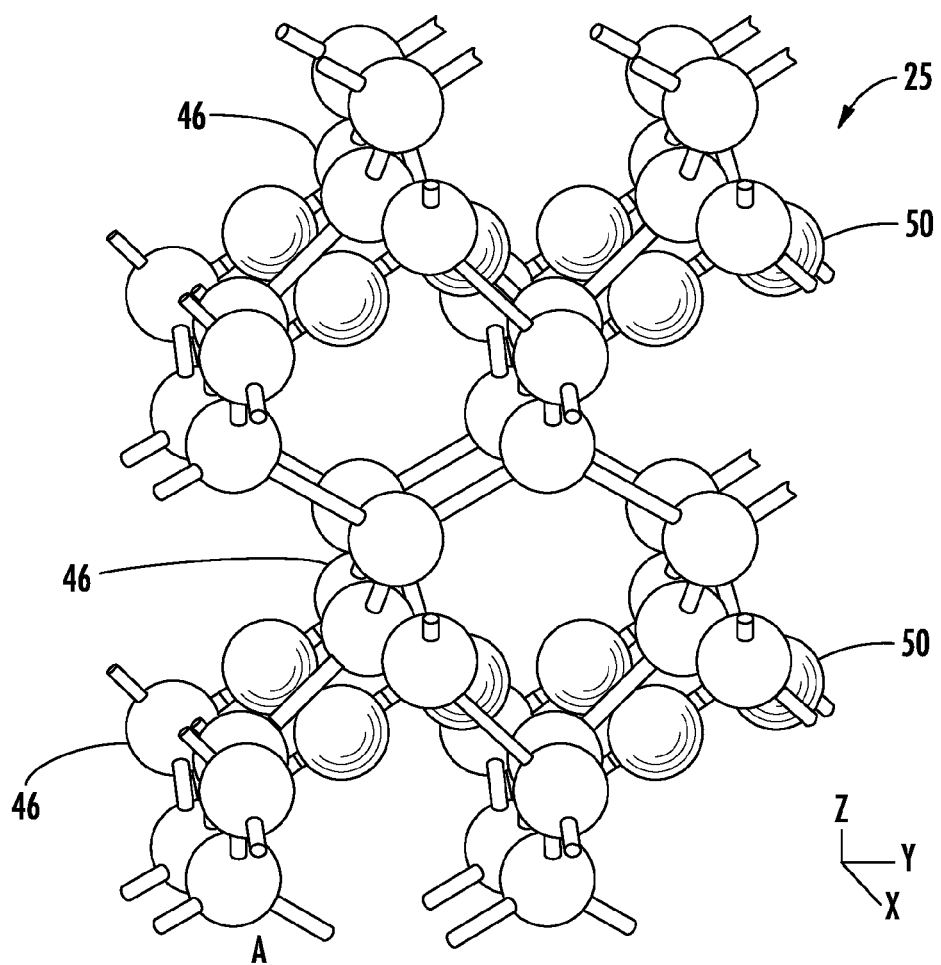
FIG. 2 is a perspective schematic atomic diagram of a portion of the superlattice shown in FIG. 1.

Referring now to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 1.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 1 for clarity of illustration.

The energy band-modifying layer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46a-46n are chemically bound together through the non-semiconductor monolayer 50 therebetween, as seen in FIG. 2. Generally speaking, this configuration is made possible by controlling the amount of non-semiconductor material that is deposited on semiconductor portions 46a-46n through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicants theorize without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band-modifying layers 50 may also cause the superlattice 25 to have a common energy band structure. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, as will be discussed further below, for example.

The superlattice 25 also illustratively includes a cap layer 52 on an upper layer group 45n. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art.

It should be noted that the term monolayer is meant to include a single atomic layer and also a single molecular layer. It is also noted that the energy band-modifying layer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one half occupation would not necessarily be the case, as will be appreciated by those skilled in the art. Indeed, it can be seen even in this schematic diagram that individual atoms of oxygen in a given monolayer are not precisely aligned along a flat plane, as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

The 4/1 repeating structure shown in FIGS. 1 and 2 for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons or holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 3:
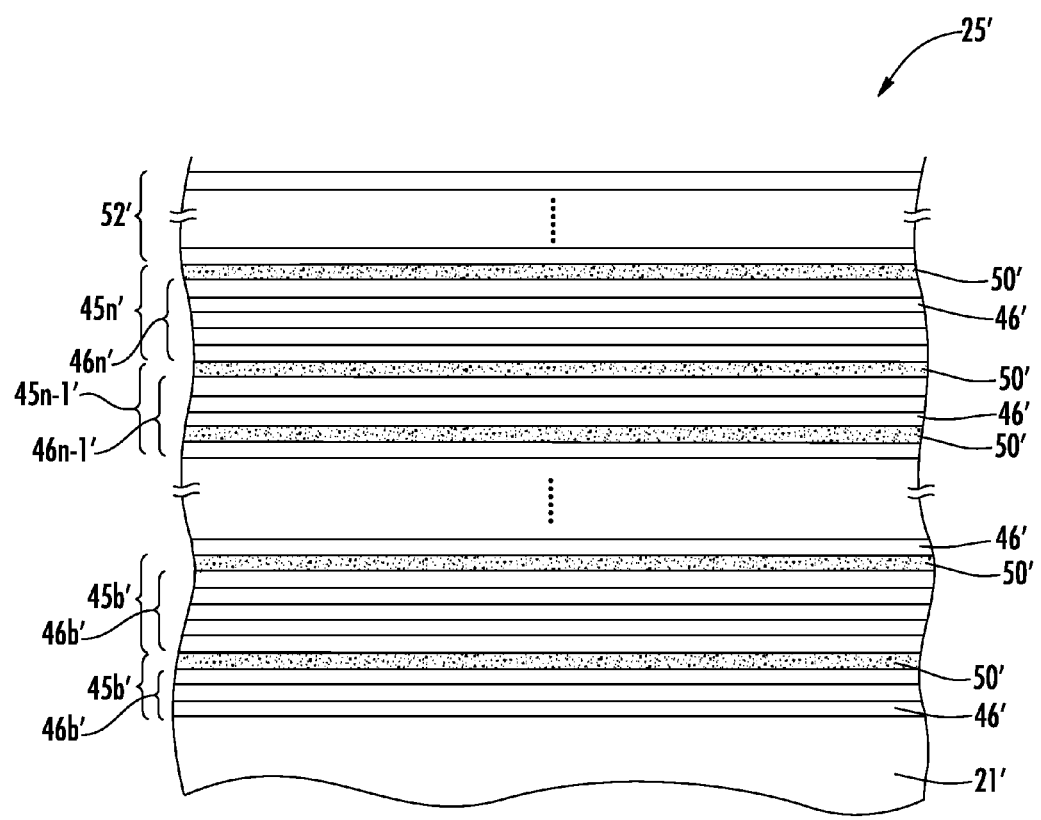
FIG. 3 is a greatly enlarged schematic cross-sectional view of another embodiment of a superlattice in accordance with the invention.

Indeed, referring now additionally to FIG. 3, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4A:
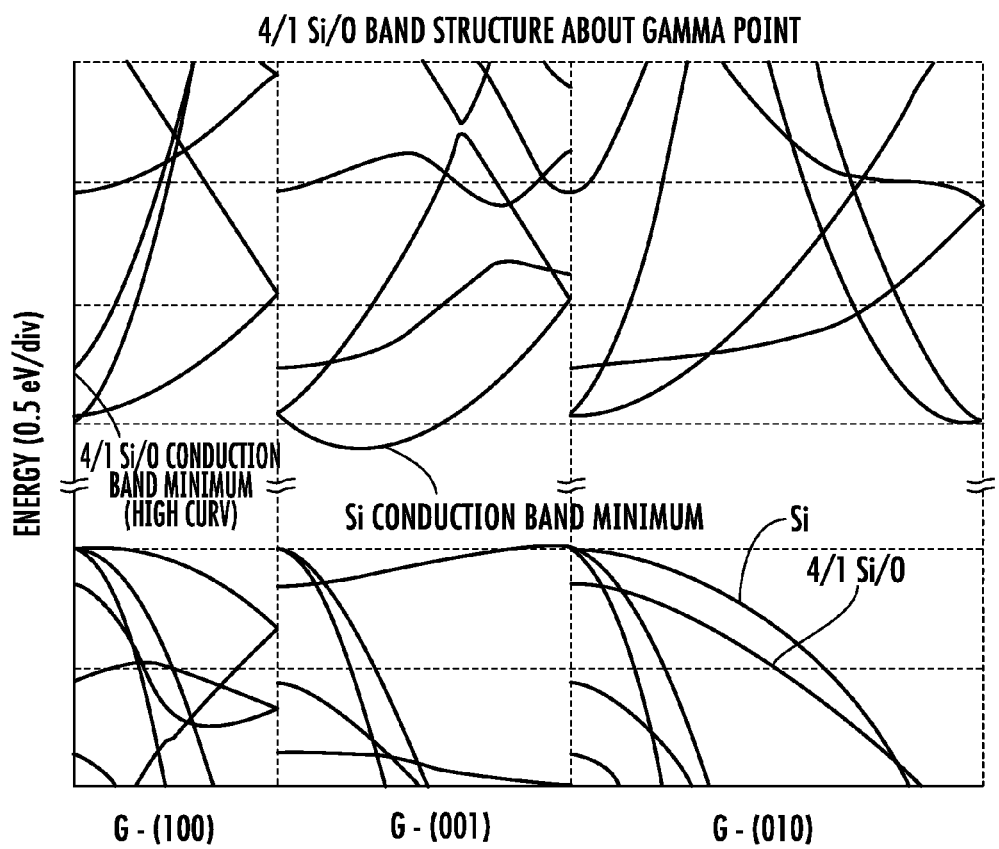
FIG. 4A is a graph of the calculated band structure from the gamma point (G) for both bulk silicon as in the prior art, and for the 4/1 Si/O superlattice as shown in FIGS. 1-2.
Figure 4B:
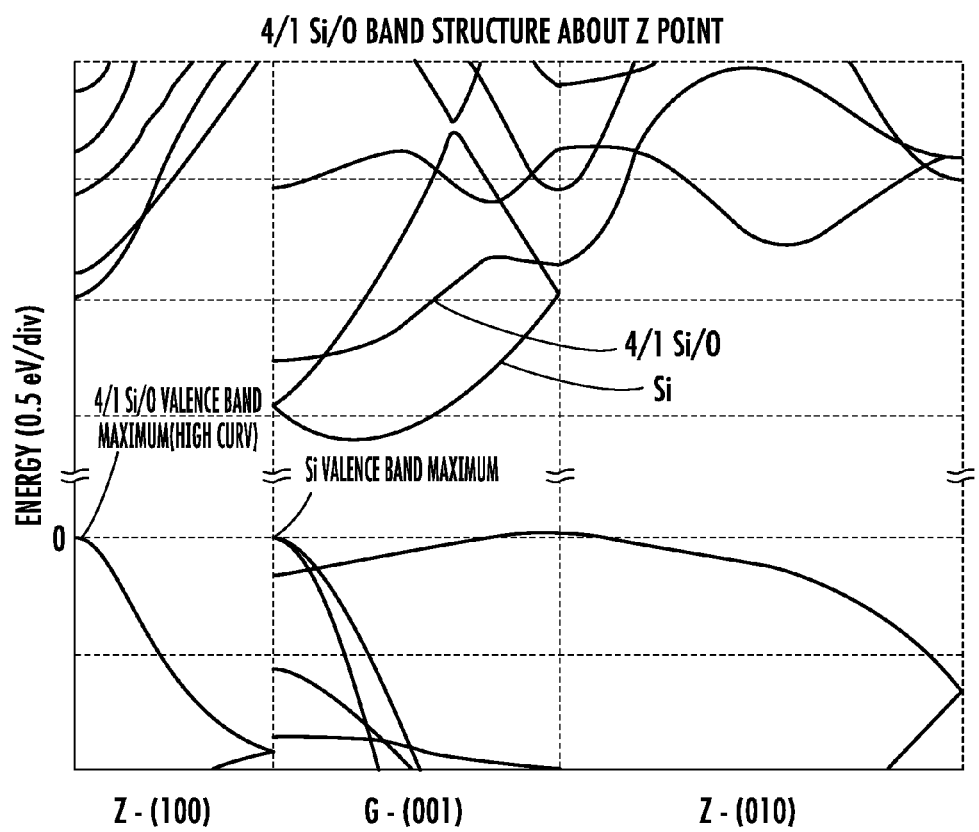
FIG. 4B is a graph of the calculated band structure from the Z point for both bulk silicon as in the prior art, and for the 4/1 Si/O superlattice as shown in FIGS. 1-2.
Figure 4C:
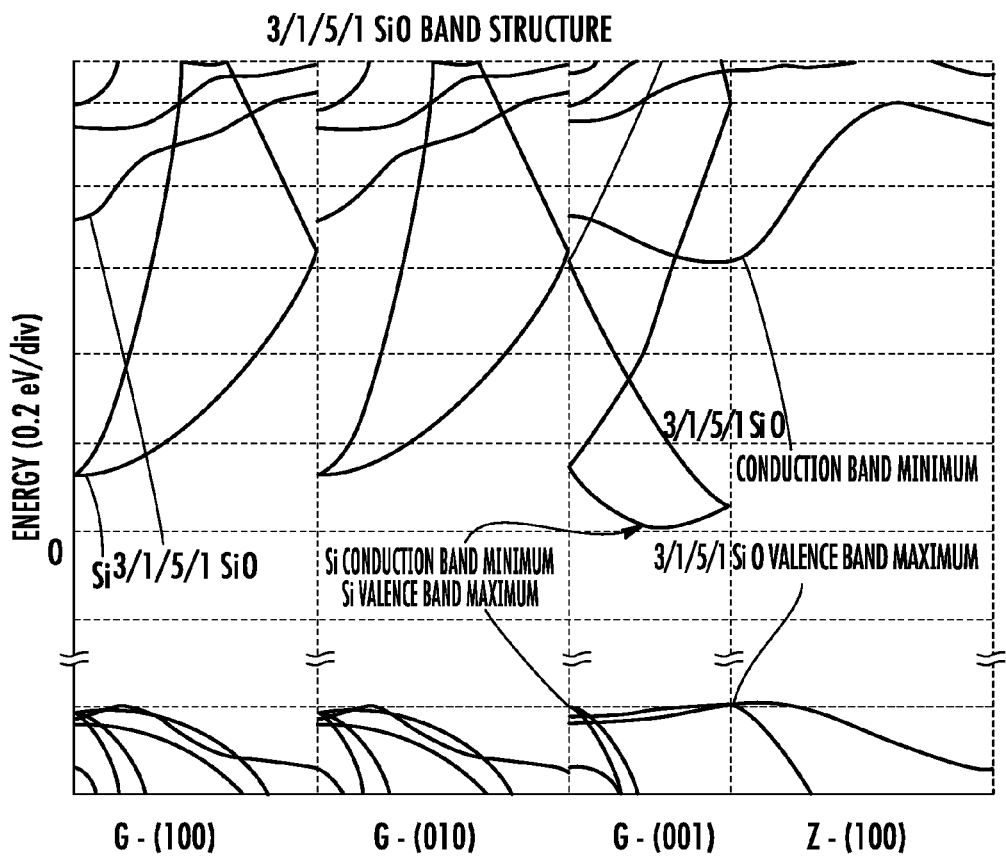
FIG. 4C is a graph of the calculated band structure from both the gamma and Z points for both bulk silicon as in the prior art, and for the 5/1/3/1 Si/O superlattice as shown in FIG. 3.

In FIGS. 4A-4C, band structures calculated using Density Functional Theory (DFT) are presented. It is well known in the art that DFT underestimates the absolute value of the bandgap. Hence all bands above the gap may be shifted by an appropriate "scissors correction." However the shape of the band is known to be much more reliable. The vertical energy axes should be interpreted in this light.

FIG. 4A shows the calculated band structure from the gamma point (G) for both bulk silicon (represented by continuous lines) and for the 4/1 Si/O superlattice 25 shown in FIG. 1 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (-110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 4B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 4C shows the calculated band structure from both the gamma and Z point for both bulk silicon (continuous lines) and for the 5/1/3/1 Si/O structure of the superlattice 25' of FIG. 3 (dotted lines). Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicants to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Figure 5:
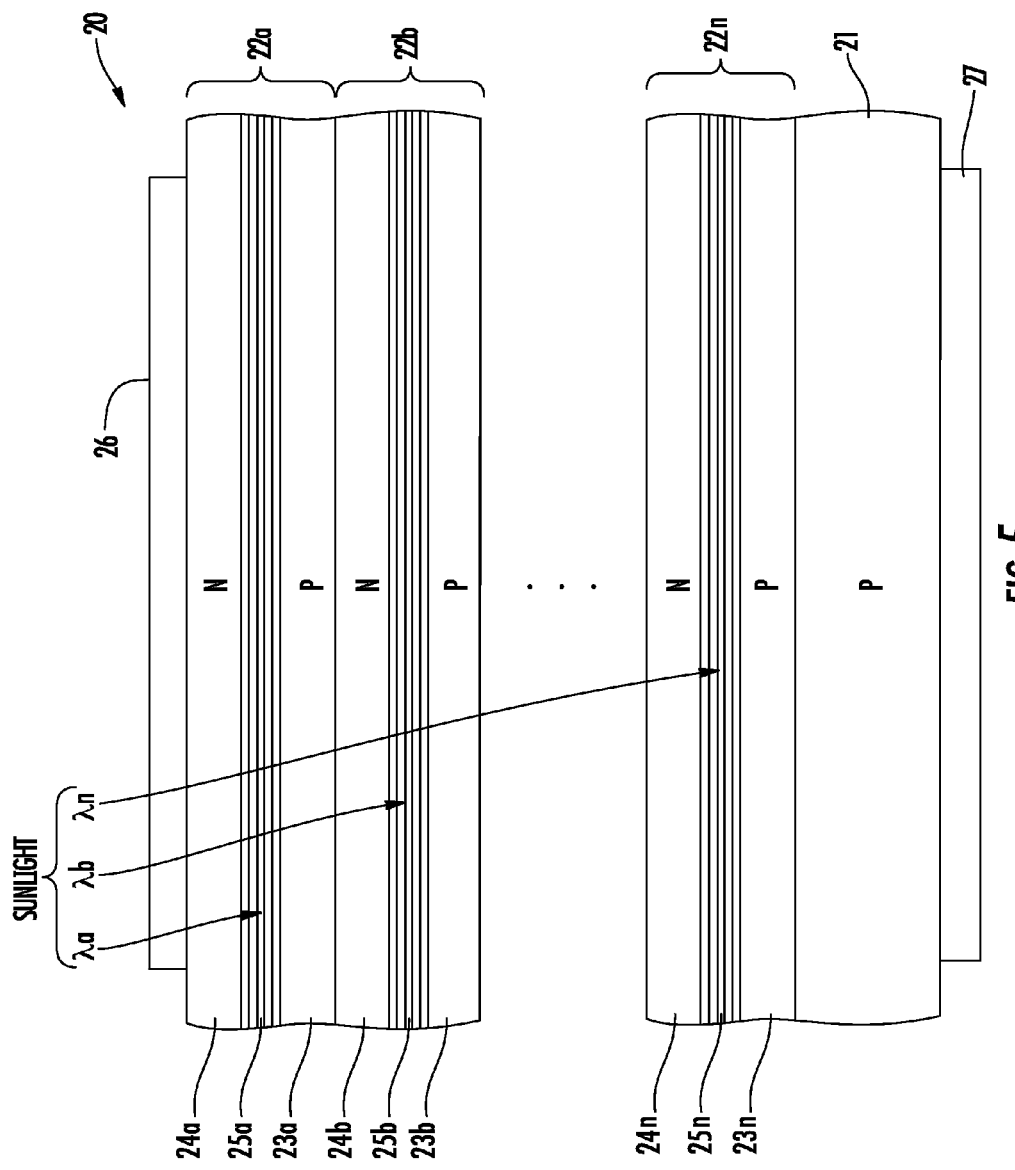
FIG. 5 is a schematic block diagram of a multiple-wavelength opto-electronic device including a plurality of vertically stacked optical devices each with a respective superlattice in accordance with the invention.

Using the above-described measures, one can select materials having improved band structures for specific purposes. One such example would be a superlattice layer 25 used in a multiple-wavelength opto-electronic device, such as a photovoltaic (PV) cell 20 shown in FIG. 5. The PV cell 20 illustratively includes a substrate 21 and a plurality of active optical devices 22a-22n carried by the substrate and operating at different respective wavelengths. In the illustrated embodiment, each active optical device 22 includes a first semiconductor layer 23, a superlattice layer 25 vertically stacked on the first semiconductor layer, and a second semiconductor layer 24 vertically stacked on the superlattice layer 25. In addition, in the present embodiment the active optical devices 25a-25n are vertically stacked on top of one another as shown.

A top or upper terminal contact 26 is on the uppermost active optical device 22a, and a bottom or backside contact 27 is on the substrate 21 opposite the bottommost active optical device 22n, as shown. In the illustrated PV cell embodiment, the upper terminal contact 26 layer is preferably a transparent contact, such as a transparent conductive oxide (TCO) (e.g., fluorine-doped tin oxide, doped zinc oxide, and indium tin oxide), although other suitable materials may also be used. The backside contact 27 may be any suitable material such as metal, for example, although other contact materials may also be used.

The first and second semiconductor layers 23, 24 are oppositely doped to define a PiN structure with the superlattice layer 25 therebetween. In the illustrated example, the first semiconductor layers 23a-23n are P-type, and the second semiconductor layers 24a-24n are N-type, although other configurations are also possible (e.g., these layers could be doped with the opposite conductivity type). As such, in the present example the upper terminal contact 26 is a −Ve contact, and the backside contact 27 is a +Ve contact.

As will be appreciated by those skilled in the art, the direct bandgap nature of the superlattice layer 25 makes it a more efficient optical detector (or transmitter) layer than silicon alone. Moreover, because the superlattice 25 also functions as a dopant diffusion blocking layer as discussed above, the superlattice is also well suited for use between P and N type layers, since the superlattice will advantageously reduce dopant diffusion or creep therebetween. Further details regarding the use of the above-described superlattice structures as dopant blocking layers may be found in co-pending U.S. application serial no. 21/380,992, which is assigned to the present Assignee and is hereby incorporated herein in its entirety by reference.

In some embodiments, it may not be necessary to include the first and/or second semiconductor layers 23, 24 in the active optical device 22. That is, portions of the superlattice 25 may instead be doped with a P/N region to define a PN junction with an N/P region above or below the superlattice 25, or both N and P regions may be doped in the superlattice layer. Further details on superlattice structures with regions of doping to provide PN junctions therein or in conjunction with an adjacent semiconductor layer may be found in U.S. Pat. No. 7,045,813 and co-pending U.S. application Ser. No. 11/097,612, both of which are assigned to the present Assignee and are hereby incorporated herein in their entireties by reference.

The substrate 21 may be a semiconductor substrate, such as silicon, for example, although other semiconductors may also be used (germanium, silicon-germanium, etc.). While the substrate 21 may be monocrystalline silicon and the layers 23-25 may be formed directly thereon in some embodiments, to provide cost savings an amorphous silicon substrate may also be used by epitaxially forming the layer 23n (i.e., a monocrystalline layer) on a separate monocrystalline substrate and transferring this layer to the amorphous substrate. One exemplary approach for cleaving a semiconductor and/or superlattice layer from one substrate and transferring/bonding the layer to another substrate is set forth in co-pending U.S. application Ser. Nos. 11/381,835 and 11/381,850, both of which are assigned to the present Assignee and are hereby incorporated herein in their entireties by reference.

The superlattice layer 25n, which also advantageously has a crystalline structure as discussed above, and the semiconductor layer 24n may then be formed on the crystalline layer 23n by epitaxial deposition, following by the deposition of the various layers 23-25 of the remaining optical detectors 22, as will be appreciated by those skilled in the art. An alternative approach is to form one or more of the devices 22a-22n on a separate crystalline substrate and then transfer the device (s) to the substrate 21, as will also be appreciated by those skilled in the art. In other embodiments, non-semiconductor substrates may also be used. For example, to provide further cost savings a glass substrate may be used, for example, through the above-described transferring process. However, other suitable substrate materials known to those skilled in the art may also be used.

As noted above, each of the active optical devices 22a-22n advantageously operates at different respective wavelengths λa-λn. Stated alternatively, each of the active optical devices 22a-22n (i.e., optical detectors in the present PV cell embodiment) are "tuned" to advantageously absorb or transmit, in the case of optical transmitters, light of a different respective wavelength. Thus, in the present example, the PV cell advantageously provides enhanced efficiency with respect to a typical single layer solar cell. This is because there are multiple detectors 22a-22n that generate electricity based upon different wavelengths of sunlight incident on the device 20, yet over a same amount of surface area as the single layer device, as will be appreciated by those skilled in the art. Accordingly, a greater quantity of energy production is achieved per the same amount of surface area.

One approach for tuning the superlattices 25a-25n to operate at different wavelengths is to form the superlattices with different layer configurations. More particularly, theoretical calculations using Generalized Gradient Approximation (GGA) and Screened Hartree-Fock (SHF) methods both indicate tunable wavelengths as a function of layer spacing/configuration. Similar calculations using just GGA also indicate that wavelength tuning is possible by varying the coverage of the non-semiconductor monolayers in the respective superlattices, as discussed above.

By way of example, using SHF methodology the calculated differences in bandgap between an 8/1 Si—O superlattice structure and a 3/1/5/1 Si—O superlattice structure relative to silicon alone are 0.21 eV and 0.58 eV, respectively. These shifts in bandgap lead to respective wavelength offsets of 217 nm and 469 nm lower than silicon. Furthermore, because the superlattice structures 25 are substantially direct bandgap materials, this leads to the ability to not only detect/generate light, but to do so at different wavelengths when each superlattice layer has a respective different bandgap than the other superlattice layers, as in the above example.

The optical detectors 22a-22n are configured to provide an output equal to a sum of photocurrents therefrom. In operation, each photon of sunlight creates an electron-hole pair that, if formed in the PN junction region and experiences an electric field, separates and moves in opposite directions resulting in current flow. Voltage can either be measured across the detectors 22a-22n (for an open-circuit) or a current (with a closed-circuit), but practically speaking, the power output (which is the product of the voltage and current) is preferably optimized for the given application, as will be appreciated by those skilled in the art.

The higher bandgap superlattice layer 25 generates a larger voltage output for the photovoltaic (PV) cell, and hence, delivers more power for an equivalent absorption efficiency (i.e. current). While there may potentially be some trade-off between closed-circuit current and open-circuit voltage when creating the PV cell 20, the stacking of several active optical detectors 22 provides a multilayer PV cell that captures an increased amount of electromagnetic (EM) radiation across a wide spectrum of energies.

While certain prior art PV cell approaches have attempted to use other stacked detector configurations to capture light of different wavelengths, particularly for solar cells made with III-V alloys, one significant drawback of such arrangements is that the strain from mismatched lattices damages the crystals. However, applicants theorize without wishing to be bound thereto that this shortcoming of such prior art structures may be alleviated by using superlattice layers 25 as described above with different superlattice spacings and different doping levels, as will be appreciated by those skilled in the art.

Figure 6:
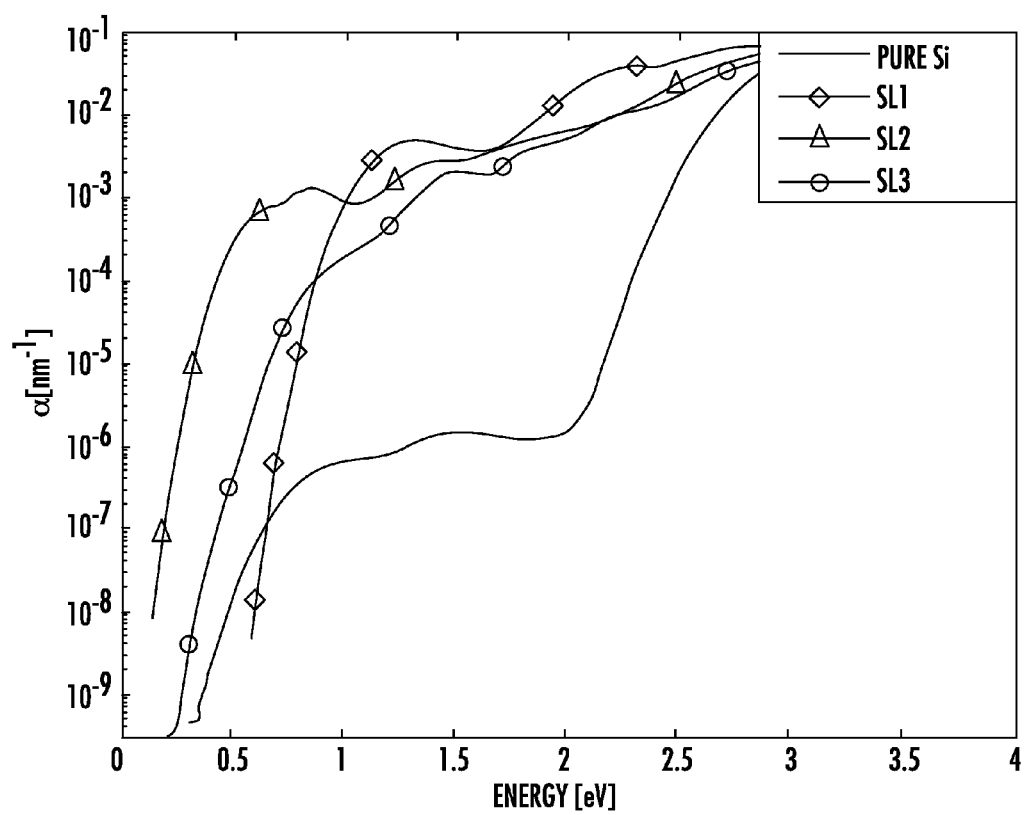
FIG. 6 is a graph of absorption vs. energy curves for pure silicon and a plurality of superlattice structures for use in accordance with the invention.

Turning now additionally to FIG. 6, absorption versus energy curves for various superlattice structures and silicon are now compared. The "area under the curve" shows that PV cells made with the above-described superlattice layers will absorb more energy per layer thickness in the lower energy region (i.e., 1-2 eV) than pure silicon. In FIG. 6, the superlattice SU is a 4-1 Si/O structure, the superlattice SL2 is a 8-1 Si/O structure, and the superlattice SL3 is a 12-1 Si/O with 50% coverage structure. Thus, even a single cell design using a superlattice 25 layer can be made thinner than with silicon, resulting in weight savings for critical applications. One example where weight may be of particular importance is in space-based solar cells, e.g., on satellites, etc. In addition, the superlattice 25 has increased absorption in the lower energy region, which is also particularly advantageous in a space-based applications, since in outer space a substantial amount of solar energy is located in the 0.5 eV to 2 eV spectral range.

Figure 7:
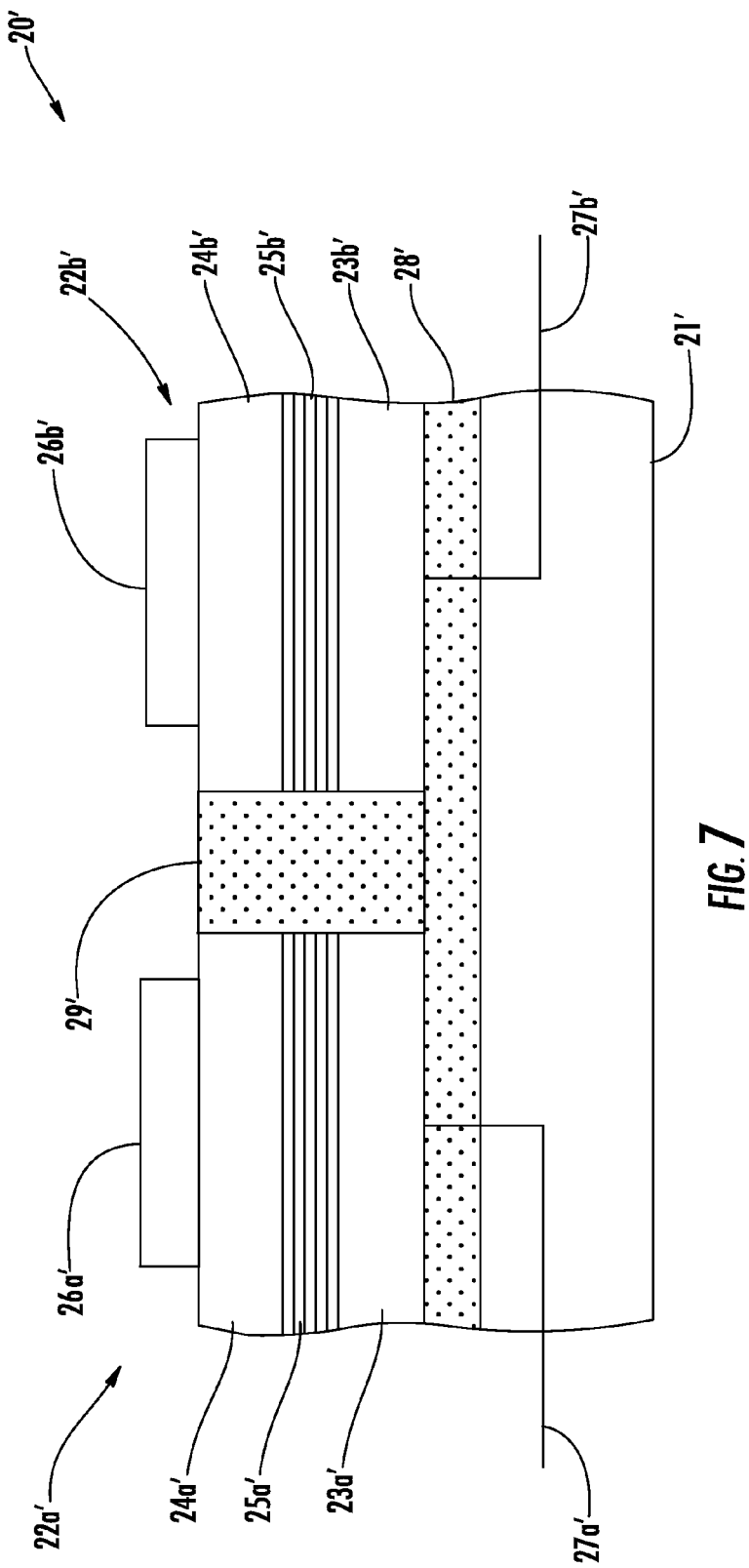
FIG. 7 is a schematic block diagram of an alternative embodiment of the multiple-wavelength opto-electronic device of FIG. 5 including a plurality of laterally adjacent optical devices.

Referring additionally to FIG. 7, another embodiment of a multiple-wavelength opto-electronic device 20' illustratively includes laterally adjacent active optical devices 22a' and 22b', although more than just the two illustrated devices may be used. The active optical devices 22a' and 22b' may be optical transmitters, optical detectors, or a combination of both optical detectors and transmitters, as will be appreciated by those skilled in the art. The active optical devices 22a' and 22b' may be used in lasers, optical communications devices, etc. The optical devices 22a' and 22b' may be coupled to respective waveguides, or to a common waveguide using wave division multiplexing (WDM) techniques known to those skilled in the art, for example. Further details on implementing the above-described superlattice films in opto-electronic applications are provided in U.S. application Ser. Nos. 10/936,903, 10/936,933, 10/936,913, and 10/937,072, which are assigned to the present Assignee and are hereby incorporated herein in their entireties by reference.

In the present example, the active optical devices are also implemented on a semiconductor (e.g., silicon) on insulator (SOI) substrate 21' having an insulating (e.g., oxide) layer 28' thereon. Further details on using the superlattice 25 in SOI implementations are provided in the above-noted co-pending U.S. application Ser. Nos. 11/381,835 and 11/381,850, and also in co-pending U.S. application Ser. Nos. 11/428,015 and 11/428,003, which are also assigned to the present Assignee and are hereby incorporated herein in their entireties by reference. Moreover, an insulating or shallow trench isolation (STI) region 29' is illustratively included between the active optical devices 22a', 22b'.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the invention.

That which is claimed is:

1. An opto-electronic device comprising:
a substrate; and
a plurality of active optical detectors carried by said substrate and having respective different spectral absorption responses;
at least one active optical detector from among the plurality thereof comprising a superlattice comprising a plurality of stacked groups of layers, and each group of layers comprising a plurality of stacked semiconductor monolayers defining a base semiconductor portion and at least one non-semiconductor monolayer thereon.

2. The opto-electronic device of claim 1 wherein said at least one non-semiconductor monolayer is constrained within a crystal lattice of adjacent base semiconductor portions, and at least some semiconductor atoms from opposing base semiconductor portions are chemically bound together through the at least one non-semiconductor monolayer therebetween.

3. The opto-electronic device of claim 1 wherein said at least one active optical detector further comprises first and second semiconductor regions on opposing sides of said superlattice and having opposite conductivity types.

4. The opto-electronic device of claim 1 wherein said plurality of active optical detectors are stacked in a vertical direction.

5. The opto-electronic device of claim 1 wherein said plurality of active optical detectors are laterally adjacent one another.

6. The opto-electronic device of claim 1 wherein said plurality of active optical detectors are configured to provide an output equal to a sum of photocurrents therefrom.

7. The opto-electronic device of claim 1 wherein at least one other one of said plurality of active optical detectors comprises a non-superlattice semiconductor junction.

8. The opto-electronic device of claim 1 further comprising at least one contact coupled to said plurality of active optical detectors.

9. The opto-electronic device of claim 1 wherein said substrate comprises a semiconductor.

10. The opto-electronic device of claim 1 wherein said substrate comprises a non-semiconductor.

11. The opto-electronic device of claim 1 wherein said substrate comprises glass.

12. The opto-electronic device of claim 1 wherein each base semiconductor portion comprises silicon.

13. The opto-electronic device of claim 1 wherein each base semiconductor portion comprises a base semiconductor selected from the group consisting of Group IV semiconductors, Group III-V semiconductors, and Group II-VI semiconductors.

14. The opto-electronic device of claim 1 wherein each non-semiconductor monolayer comprises oxygen.

15. The opto-electronic device of claim 1 wherein each non-semiconductor monolayer comprises a non-semiconductor selected from the group consisting of oxygen, nitrogen, fluorine, and carbon-oxygen.

16. An opto-electronic device comprising:
a substrate; and
a plurality of active optical detectors carried by said substrate and having respective different spectral absorption responses, said plurality of active optical detectors being arranged in a vertically stacked arrangement;
at least one active optical detector from among the plurality thereof comprising a superlattice comprising a plurality of stacked groups of layers, and each group of layers comprising a plurality of stacked semiconductor monolayers defining a base semiconductor portion and at least one non-semiconductor monolayer thereon;
at least one other one of said plurality of active optical detectors comprising a non-superlattice semiconductor junction.

17. The opto-electronic device of claim 16 wherein said at least one non-semiconductor monolayer is constrained within a crystal lattice of adjacent base semiconductor portions, and at least some semiconductor atoms from opposing base semiconductor portions are chemically bound together through the at least one non-semiconductor monolayer therebetween.

18. The opto-electronic device of claim 16 wherein said at least one active optical detector further comprises first and second semiconductor regions on opposing sides of said superlattice and having opposite conductivity types.

19. The opto-electronic device of claim 16 wherein said plurality of active optical detectors are configured to provide an output equal to a sum of photocurrents therefrom.

20. The opto-electronic device of claim 16 further comprising at least one contact coupled to said plurality of active optical detectors.

21. The opto-electronic device of claim 16 wherein said substrate comprises a semiconductor.

22. The opto-electronic device of claim 16 wherein said substrate comprises a non-semiconductor.

23. The opto-electronic device of claim 16 wherein each base semiconductor portion comprises a base semiconductor selected from the group consisting of Group IV semiconductors, Group III-V semiconductors, and Group II-VI semiconductors.

24. The opto-electronic device of claim 16 wherein each non-semiconductor monolayer comprises a non-semiconductor selected from the group consisting of oxygen, nitrogen, fluorine, and carbon-oxygen.

25. A method for making an opto-electronic device comprising:
    forming a plurality of active optical detectors carried by a substrate and having respective different spectral absorption responses;
    at least one active optical detector from among the plurality thereof comprising a superlattice comprising a plurality of stacked groups of layers, and each group of layers comprising a plurality of stacked semiconductor monolayers defining a base semiconductor portion and at least one non-semiconductor monolayer thereon.

26. The method of claim 25 wherein the at least one non-semiconductor monolayer is constrained within a crystal lattice of adjacent base semiconductor portions, and at least some semiconductor atoms from opposing base semiconductor portions are chemically bound together through the at least one non-semiconductor monolayer therebetween.

27. The method of claim 25 wherein the at least one active optical detector further comprises first and second semiconductor regions on opposing sides of the superlattice and having opposite conductivity types.

28. The method of claim 25 wherein the plurality of active optical detectors are stacked in a vertical direction.

29. The method of claim 25 wherein the plurality of active optical detectors are laterally adjacent one another.

30. The method of claim 25 wherein the plurality of active optical detectors are configured to provide an output equal to a sum of photocurrents therefrom.

31. The method of claim 25 wherein at least one other one of the plurality of active optical detectors comprises a non-superlattice semiconductor junction.

32. The method of claim 25 further comprising forming at least one contact coupled to the plurality of active optical detectors.

33. The method of claim 25 wherein each base semiconductor portion comprises a base semiconductor selected from the group consisting of Group IV semiconductors, Group III-V semiconductors, and Group II-VI semiconductors.

34. The method of claim 25 wherein each non-semiconductor monolayer comprises a non-semiconductor selected from the group consisting of oxygen, nitrogen, fluorine, and carbon-oxygen.

* * * * *